(12) United States Patent
Lee

(10) Patent No.: US 7,541,571 B2
(45) Date of Patent: Jun. 2, 2009

(54) IMAGE SENSOR HAVING FIRST AND SECOND CHARGE TRANSMITTERS

(75) Inventor: Jun-Taek Lee, Hwaseong-si (KR)

(73) Assignee: Samsung Electronics., Co., Ltd., Suwon-si, Gyeonggi-do (KR)

( * ) Notice: Subject to any disclaimer, the term of this patent is extended or adjusted under 35 U.S.C. 154(b) by 97 days.

(21) Appl. No.: 11/351,441

(22) Filed: Feb. 10, 2006

(65) Prior Publication Data

US 2006/0180745 A1    Aug. 17, 2006

(30) Foreign Application Priority Data

Feb. 11, 2005    (KR) .................. 10-2005-0011698

(51) Int. Cl.
*H01J 40/14*    (2006.01)

(52) U.S. Cl. .................. 250/214.1; 250/214 DC; 250/208.1; 257/445; 348/299

(58) Field of Classification Search .......... 250/214.1, 250/214 R, 214 DC, 208.1; 257/445, 452, 257/458; 348/299, 300, 307, 309
See application file for complete search history.

(56) References Cited

U.S. PATENT DOCUMENTS

| | | | |
|---|---|---|---|
| 5,043,571 A * | 8/1991 | Hasegawa | 250/226 |
| 5,124,544 A * | 6/1992 | Ohzu | 348/297 |
| 6,259,124 B1 * | 7/2001 | Guidash | 257/292 |
| 6,504,193 B1 * | 1/2003 | Ishiwata et al. | 257/291 |
| 2005/0067640 A1 * | 3/2005 | Ohkawa | 257/291 |
| 2006/0038207 A1 * | 2/2006 | Hong et al. | 257/292 |

FOREIGN PATENT DOCUMENTS

| | | |
|---|---|---|
| JP | 02330346 | 11/2002 |
| KR | 19990058292 | 7/1999 |
| KR | 100292152 | 3/2001 |
| KR | 20020027021 | 4/2002 |
| KR | 20030096658 | 12/2003 |
| KR | 1020030096659 | 12/2003 |

OTHER PUBLICATIONS

English Abstract.
English Abstract for Publication No. 100292152.
English Abstract for Publication No. 1020030096659.
English Abstract for Publication No. 1999-0058292.

* cited by examiner

*Primary Examiner*—Thanh X Luu
*Assistant Examiner*—Francis M Legasse, Jr.
(74) *Attorney, Agent, or Firm*—F. Chau & Associates, LLC

(57) ABSTRACT

An image sensor includes a photoelectric converter formed in a semiconductor substrate to generate and integrate charges resulting from incident light, a first charge transmitter transmitting integrated charges to a charge detector, an overflow drain region discharging excess charges generated by the photoelectric converter, and a second charge transmitter transmitting the excess charges to the overflow drain region and having a width which is at least half of a span of the photoelectric converter.

12 Claims, 13 Drawing Sheets

IMAGE SENSOR HAVING FIRST AND SECOND CHARGE TRANSMITTERS

CROSS-REFERENCE TO RELATED APPLICATION

This application claims priority from Korean Patent Application No. 10-2005-0011698 filed on Feb. 11, 2005 in the Korean Intellectual Property Office, the disclosure of which is incorporated herein by reference in its entirety.

BACKGROUND OF THE INVENTION

1. Field of the Invention

The present invention relates to an image sensor, and more particularly, to an image sensor having improved image reproducibility.

2. Description of Related Art

An image sensor converts optical information into electrical signals. Recently, with the development of computer and communication industries, there is an increasing demand for highly-efficient image sensors in various fields such as digital cameras, camcorders, personal communication systems, game devices, surveillance cameras, microcameras for medical use, robots, and so on.

An image sensor includes a pixel array, in which unit pixels are arranged in a matrix form and convert incident light into an electrical signal. The pixel array further includes a peripheral circuit controlling each unit pixel and processing the electrical signal of the unit pixel. The peripheral circuit may process an optical image input to the pixel array in various manners, for example, in a rolling shutter mode for processing moving images and a single frame capture mode (SFCM) for processing still images.

In the rolling shutter mode, since optical images input to the pixel array in real time are sequentially read by row, each row in the pixel array is exposed at a different time. In an SFCM (single frame capture mode), an entire optical image input through electrical shuttering is simultaneously transmitted to a charge detector of the pixel array and a signal stored in the charge detector is read by row.

When light is continuously incident on the pixel array in the SFCM, excess charges occurring in a photoelectric converter overflow into the charge detector, which may cause distortion in an image. Since overflowing charges increase while rows are read out sequentially, image distortion increases due to a read-out time difference between, for example, the first row and the last row.

Moreover, a plurality of unit pixels sharing a charge detector use the charge detector in time division mode. Accordingly, a read-out time difference occurs between the pixel units sharing the charge detector, and thus image distortion due to a time difference between pixel units may occur.

Therefore, a need exists for an image sensor having improved image reproducibility.

SUMMARY OF THE INVENTION

According to an embodiment of the present invention, an image sensor includes a photoelectric converter formed in a semiconductor substrate to generate charges and integrate the charges resulting from incident light, a first charge transmitter transmitting integrated charges to a charge detector, an overflow drain region discharging excess charges generated by the photoelectric converter, and a second charge transmitter transmitting the excess charges to the overflow drain region and having a width which is at least half of a span of the photoelectric converter.

According to another embodiment of the present invention, an image sensor includes a pixel array in which a plurality of unit pixels are arranged in two dimensions, wherein each unit pixel comprises a photoelectric converter formed in a semiconductor substrate to generate charges and integrate the charges resulting from incident light, a first charge transmitter transmitting integrated charges to a charge detector, an overflow drain region discharging excess charges generated by the photoelectric converter, and a second charge transmitter transmitting the excess charges to the overflow drain region and having a width which is at least half of a span of the photoelectric converter, and photoelectric converters of the plurality of unit pixels share the overflow drain region via second charge transmitters of the plurality of unit pixels.

BRIEF DESCRIPTION OF THE DRAWINGS

The present invention will become more apparent by describing in detail preferred embodiments thereof with reference to the attached drawings in which.

DETAILED DESCRIPTION OF PREFERRED EMBODIMENTS

Figure 1:
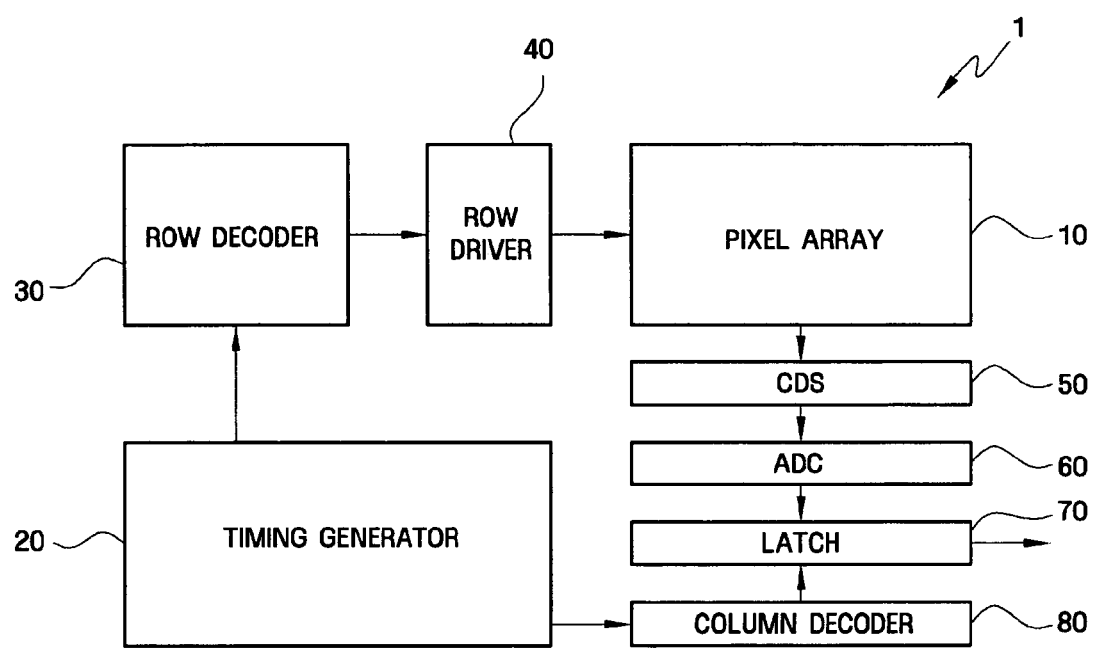
FIG. 1 is a block diagram of an image sensor according to an embodiment of the present invention.

The present invention may be embodied in many different forms and should not be construed as being limited to embodiments set forth herein. Rather, embodiments are provided so that this disclosure will be thorough and complete and will fully convey the concept of the invention to those skilled in the art. Like reference numerals refer to like elements throughout the specification.

According to an embodiment of the present invention, an image sensor may include a charge coupled device (CCD) image sensor or a complementary metal oxide semiconductor (CMOS) image sensor. While the present invention will be described with reference to the CMOS image sensor, the technical spirit of the present invention can also be applied to a CCD image sensor.

Image sensors according to an embodiment of the present invention will now be described more fully with reference to FIGS. 1 through 17, in which preferred embodiments of the invention are shown.

FIG. 1 is a block diagram of an image sensor 1 according to an embodiment of the present invention. The image sensor 1 includes a pixel array 10, a timing generator 20, a row decoder 30, a row driver 40, a correlated double sampler (CDS) 50, an analog-to-digital converter (ADC) 60, a latch 70, and a column decoder 80.

The pixel array 10 includes a plurality of unit pixels arranged in two dimensions. The plurality of unit pixels convert an optical image into an electrical signal. The pixel array 10 operates in response to a plurality of driving signals such as a pixel selection signal (ROW), a reset signal (RST), and first and second charge transmission signals (TG1 and TG2) received from the row driver 40. The pixel array 10 provides the electrical signal to the CDS 50 via a vertical signal line.

The timing generator 20 provides a timing signal and a control signal to the row decoder 30 and the column decoder 80.

The row driver 40 provides the plurality of driving signals to the pixel array 10 to operate the plurality of unit pixels according to a decoding result of the row decoder 30. When the unit pixels are arranged in a matrix form, a driving signal is provided for each row. The CDS 50 receives the electrical signal from the pixel array 10 via the vertical signal line and performs holding and sampling operations.

The CDS 50 double samples a reference voltage level (hereinafter, referred to as a "noise level") and a voltage level of the electrical signal (hereinafter, referred to as a "signal level") and outputs a differential level corresponding to a difference between the noise level and the signal level. The CDS 50 outputs an analog signal corresponding to the differential level.

The ADC 60 converts the analog signal corresponding to the differential level output by the CDS 50 into a digital signal. The ADC 60 outputs the digital signal.

The latch 70 latches the digital signal output by the ADC 60. The latched signal is sequentially output to an image signal processor (not shown) according to a decoding result of the column decoder 80.

Figure 2:
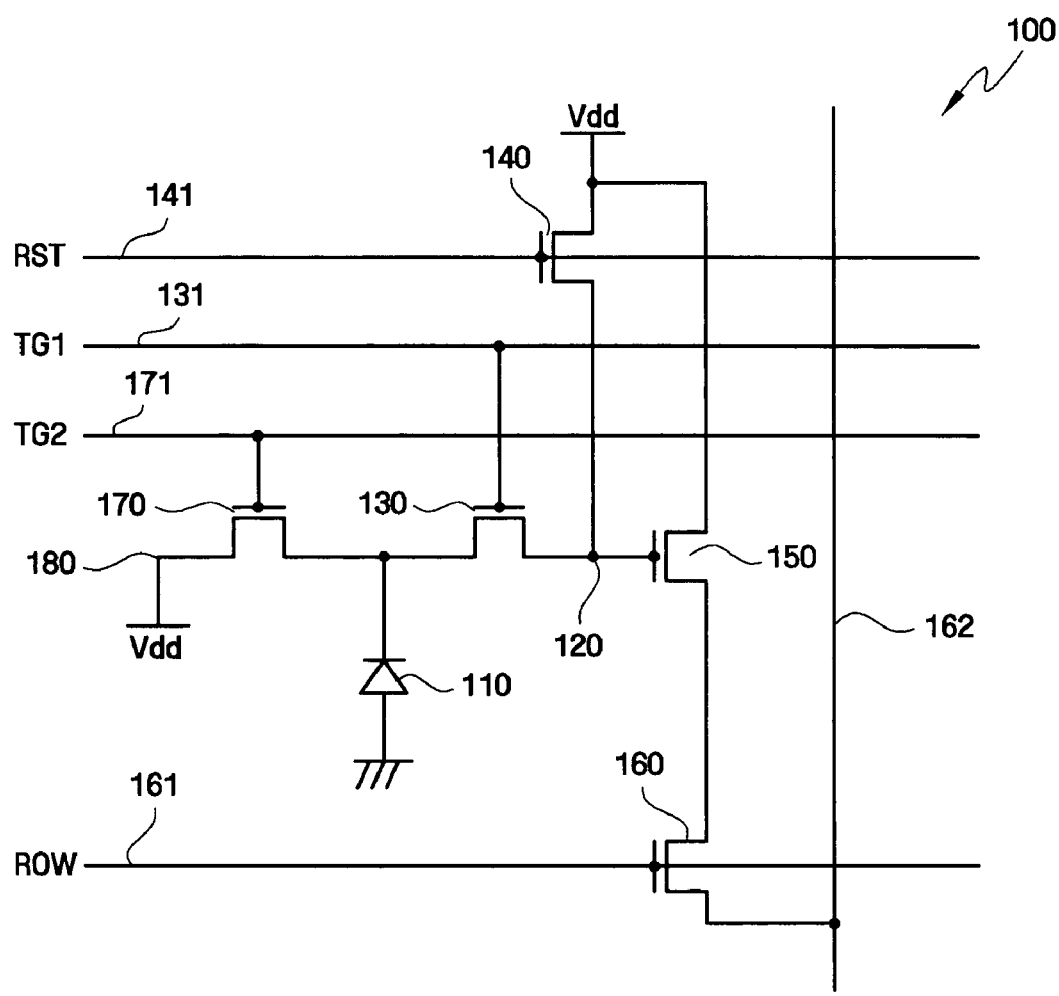
FIG. 2 is a circuit diagram of a unit pixel in an image sensor, according to an embodiment of the present invention.
Figure 3:
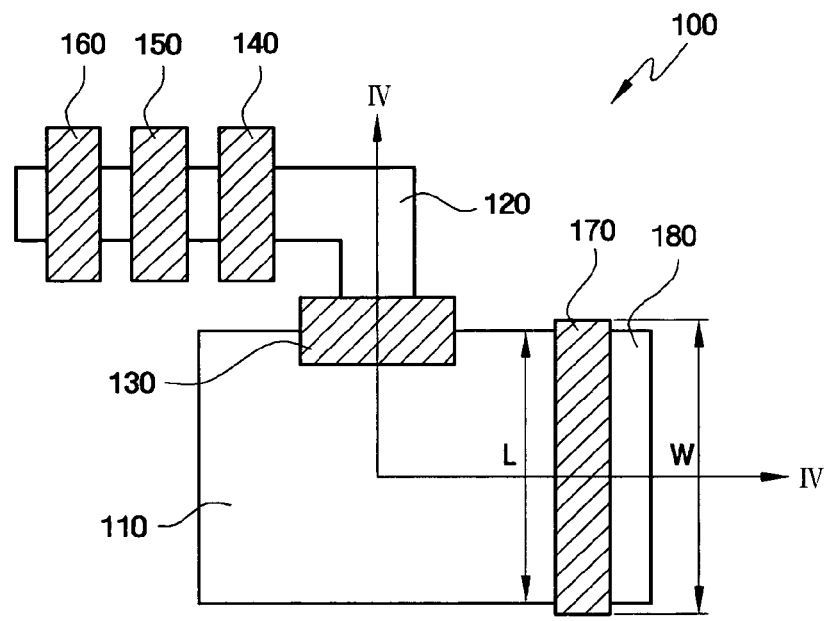
FIG. 3 is a schematic plan view of the unit pixel of the image sensor of FIG. 2.
Figure 4:
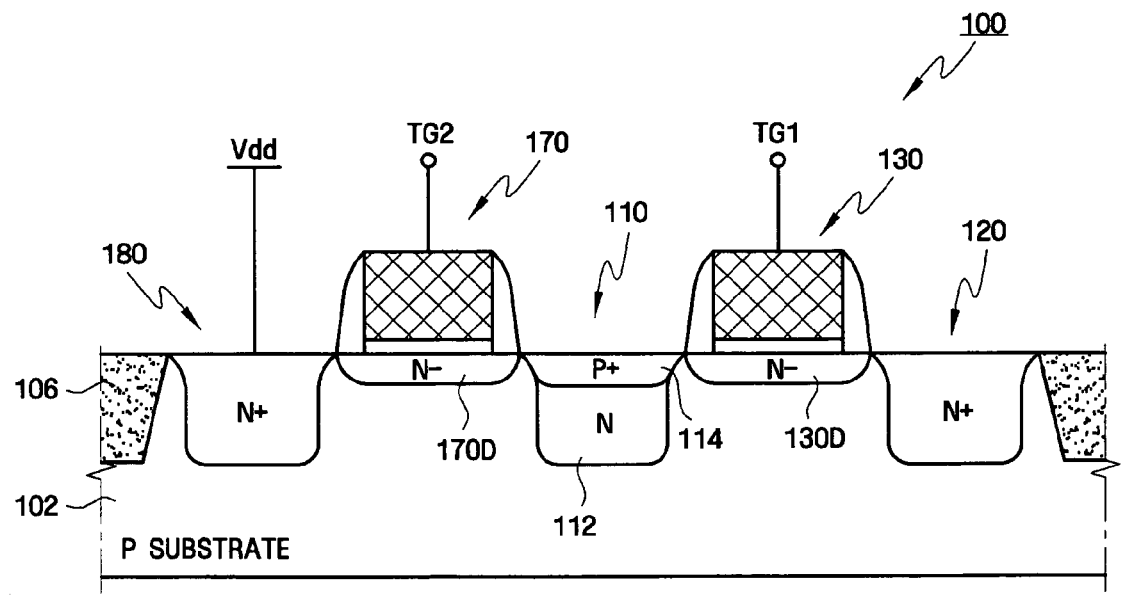
FIG. 4 is a cross sectional view of the unit pixel, taken along the line IV-IV' shown in FIG. 3.

FIG. 2 is a circuit diagram of a unit pixel 100 in an image sensor, according to an embodiment of the present invention. FIG. 3 is a schematic plan view of the unit pixel 100 of the image sensor of FIG. 2. FIG. 4 is a cross sectional view of the unit pixel 100, taken along the line IV-IV' shown in FIG. 3.

Referring to FIGS. 2 and 3, the unit pixel 100 of an image sensor according to an embodiment of the present invention includes a photoelectric converter 110, a charge detector 120, a first charge transmitter 130, a reset unit 140, an amplifier 150, a selector 160, and a second charge transmitter 170.

The photoelectric converter 110 generates and integrates charges resulting from incident light. The photoelectric converter 110 may be a photodiode, a phototransistor, a photogate, a pinned photodiode (PPD), or a combination of the same.

The charge detector 120 is implemented as a floating diffusion (FD) region and receives the integrated charges from the photoelectric converter 110. Since the charge detector 120 has a parasitic capacitance, the electric charges are cumulatively stored in the charge detector 120. The charge detector 120 is electrically connected to a gate of the amplifier 150 and thus controls the amplifier 150.

The first charge transmitter 130 transmits the charges from the photoelectric converter 110 to the charge detector 120. The first charge transmitter 130 comprises a transistor and is controlled by a first charge transmission signal TG1.

The reset unit 140 periodically resets the charge detector 120. A source of the reset unit 140 is connected to the charge detector 120. A drain of the reset unit 140 is connected to the power supply voltage Vdd. The reset unit 140 operates in response to the reset signal RST.

The amplifier 150 in combination with a constant current source (not shown) positioned outside the unit pixel 100 acts as a source follower buffer amplifier. A voltage varying in response to a voltage of the charge detector 120 is output from the amplifier 150 to a vertical signal line 162. A source of the amplifier 150 is connected to a drain of the selector 160. A drain of the amplifier 150 is connected to the power supply voltage Vdd.

The selector 160 selects the unit pixel 100 to be read by row. The selector 160 operates in response to the pixel select signal ROW, and a source of the selector 160 is connected to the vertical signal line 162.

The second charge transmitter 170 transmits excess charges generated by the photoelectric converter 110 to an overflow drain region 180. The second charge transmitter 170 may be a metal-oxide semiconductor (MOS) transistor, which has a gate controlled by a second charge transmission signal TG2, a source connected to the photoelectric converter 110, and a drain connected to a positive voltage, e.g., Vdd. The second charge transmission signal TG2 may be a predetermined positive voltage or may be a clock signal which transits to a high level after a high-to-low transition of the first charge transmission signal TG1. It is preferable that the second charge transmission signal TG2 is adjusted such that a potential barrier peak of the second charge transmitter) 170 is lower than a potential barrier peak of the first charge transmitter 130 in order to transmit excess charges generated by the photoelectric converter 110 to the overflow drain region 180 via the second charge transmitter 170 before the excess charges overflow into the charge detector 120.

The second charge transmitter 170 may be disposed adjacent to an edge of the photoelectric converter 110. A width W of the second charge transmitter 170 may be substantially the same as a span L of the photoelectric converter 110. Since a region through which the excess charges pass increases as the width W of the second charge transmitter 170 increases, a drain characteristic can be improved.

The unit pixel 100 substantially prevents image distortion that may occur due to the overflow of excess charges from the photoelectric converter 110 into the charge detector 120 when high illumination light is continuously incident in a single frame capture mode (SFCM). In addition, a blooming effect due to the excess charges is substantially prevented.

Driving signal lines 131, 141, 161, and 171 of the respective first charge transmitter 130, reset unit 140, selector 160, and second charge transmitter 170 extend in a row direction (i.e., a horizontal direction of FIG. 2) so that unit pixels on the same row of the pixel array operate simultaneously.

Referring to FIG. 4, the unit pixel 100 includes a semiconductor substrate 102, a device isolation region 106, the photoelectric converter 110, the charge detector 120, the first charge transmitter 130, the second charge transmitter 170, and the overflow drain region 180. In FIG. 4, it is assumed that the photoelectric converter 110 is implemented as a pinned photodiode (PPD).

The semiconductor substrate 102 may be a P substrate and includes an active region and the device isolation region 106. Although not shown, a P epitaxial layer may be grown on, or a well region may be formed in, an upper portion of the semiconductor substrate 102 and the photoelectric converter 110 and the first and second charge transmitters 130 and 170 may be formed on the P epitaxial layer or the well region.

The device isolation region 106 defines an active region of the semiconductor substrate 102. The device isolation region 106 may be a field oxide (FOX) or shallow trench isolation region formed using a local oxidation of silicon (LOCOS) method.

The photoelectric converter 110 absorbs light energy and generates and integrates charges. The photoelectric converter 110 includes an N photodiode 112 and P+ pinning layer 114. The photodiode 112 and the pinning layer 114 are formed using two different ion-implantations. For example, the photodiode 112 is formed by ion-implanting n-type dopants into the semiconductor substrate 102, and the pinning layer 114 is formed by ion-implanting a high dose of p$^+$-type dopants into an upper portion of the photodiode 112 at low energy. The doping density and location may vary depending on a manufacturing process and design.

In an image sensor, surface damage on the photodiode 112 causes dark current. The surface damage may be caused by dangling silicon bonds or may be caused by defects related to etching stress during manufacturing of a gate or a spacer. When the photodiode 112 is formed deep in the semiconductor substrate 102 and then the pinning layer 114 is formed, the dark current is substantially prevented from occurring.

The charge detector 120 receives the charges integrated by the photoelectric converter 110 via the first charge transmitter 130. The charge detector 120 may be formed by performing ion-implantation of an N+ dopant.

The first charge transmitter 130 may be implemented as a depletion-type transistor to substantially prevent an overflow into the photoelectric converter 110 and a blooming effect which may occur when excess light energy is received.

Since a channel is formed in the first charge transmitter 130 implemented as the depletion-type transistor even during a "disable" mode, some charges can be transmitted to the charge detector 120 via the first charge transmitter 130 when at least a predetermined amount of charges are generated by the photoelectric converter 110. An N– ion-implantation region 130D underlying the first charge transmitter 130 acts as the channel. Such a depletion-type transistor substantially prevents the overflow and the blooming effect in a mode such as a rolling shutter mode, but may cause excess charges generated by the photoelectric converter 110 to overflow into the charge detector 120, thereby distorting an image in the SFCM.

The second charge transmitter 170 transmits the excess charges to the overflow drain region 180 in the SFCM before the excess charges overflow via the first charge transmitter 130. Accordingly, it is preferable that the second charge transmission signal TG2 is adjusted such that a potential barrier peak of the second charge transmitter 170 is lower than a potential barrier peak of the first charge transmitter 130. The second charge transmitter 170 may be a MOS transistor which has a gate electrode connected to the second charge transmission signal TG2 and source and drain regions electrically connected to the photoelectric converter 110 and the overflow drain region 180, respectively. The second charge transmission signal TG2 may be a predetermined positive voltage or may be a clock signal which transits to a high level after a high-to-low transition of the first charge transmission signal TG1.

The second charge transmitter 170 may include an ion-implantation region 170D underlying the gate electrode. The ion-implantation region 170D is formed by performing ion-implantation of an N dopant, a P dopant, or a combination thereof. When the ion-implantation region 170D is an N– type, as shown in FIG. 4, it lowers a potential barrier.

Although not shown, when the ion-implantation region 170D is a P+ type, it raises the potential barrier. Accordingly, the conductivity type of the ion-implantation region 170D may be determined taking into account the voltage level of the second charge transmission signal TG2 applied to the gate electrode.

The overflow drain region 180 discharges the excess charges transmitted via the second charge transmitter 170 outside the image sensor. Accordingly, the overflow drain region 180 may be electrically connected to a predetermined positive voltage, such as a power supply voltage Vdd.

Figure 5:
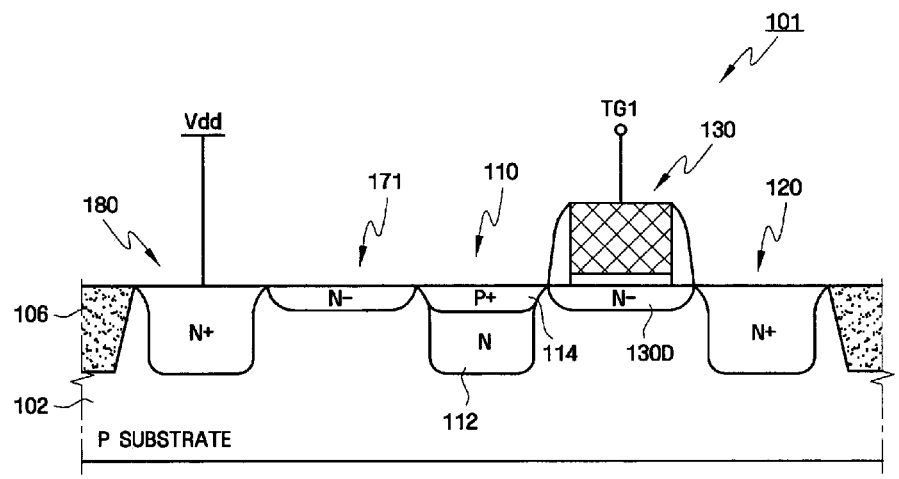
FIG. 5 is a cross sectional view of a unit pixel of an image sensor according to another embodiment of the present invention.
Figure 6:
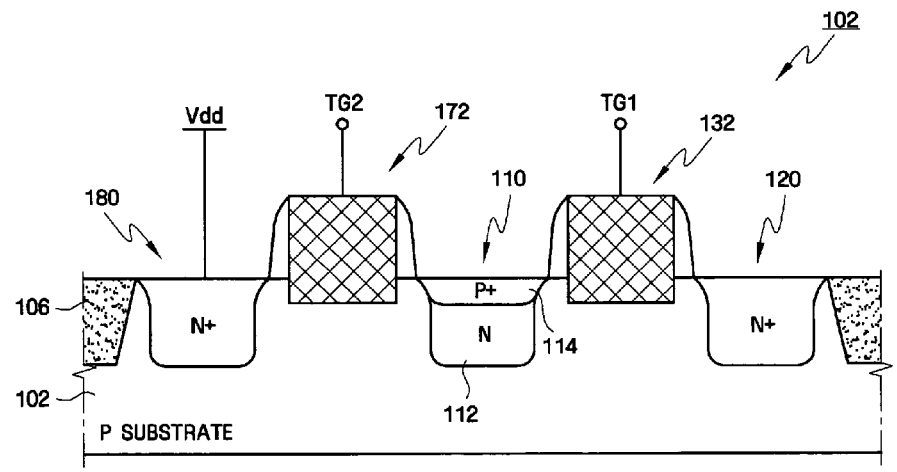
FIG. 6 is a cross sectional view of a unit pixel of an image sensor according to still another embodiment of the present invention.

FIG. 5 is a cross sectional view of a unit pixel of an image sensor according to another embodiment of the present invention. FIG. 6 is a cross sectional view of a unit pixel of an image sensor according to still another embodiment of the present invention. For brevity, components having the same function as described with reference to FIG. 4 are respectively identified by the same reference numeral and a repetitive description thereof will be omitted.

Referring to FIG. 5, a unit pixel 101 includes a second charge transmitter 171 that may be an ion-implantation region formed between the photoelectric converter 110 and the overflow drain region 180. Here, a potential barrier is adjusted according to an ion-implantation concentration without a separate MOS transistor.

Referring to FIG. 6, a unit pixel 102 includes a second charge transmitter 172 that may be a recess-type MOS transistor. As a resolution of the image sensor increases, a plurality of unit pixels are formed in a smaller area. Accordingly, the size of a MOS transistor used in the unit pixel 102 decreases. In this case, the length of a channel also decreases, and a depletion region in a source/drain region expands into the channel. As a result, a short channel effect may occur, so that an effective channel length and a threshold voltage decrease. In addition, when a high voltage is applied to a MOS transistor having a short channel, a hot carrier may infiltrate into an oxide layer. To overcome this problem, a trench-type transistor having a bulk channel may be used by forming a gate within the semiconductor substrate 102.

Figure 7:
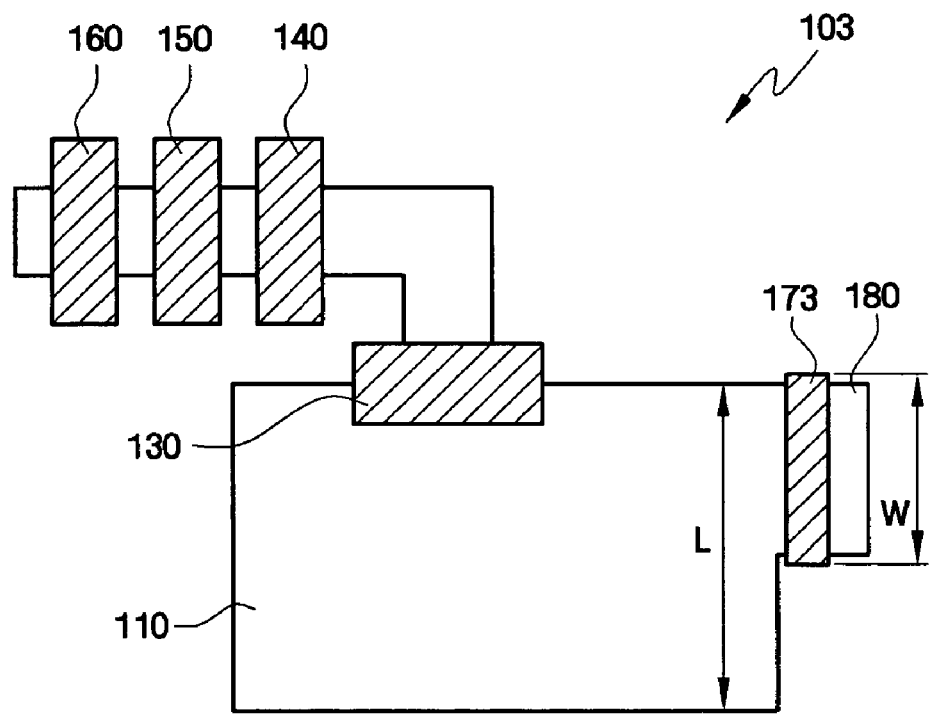
FIG. 7 is a schematic plan view of a unit pixel of an image sensor according to yet another embodiment of the present invention.
Figure 8:
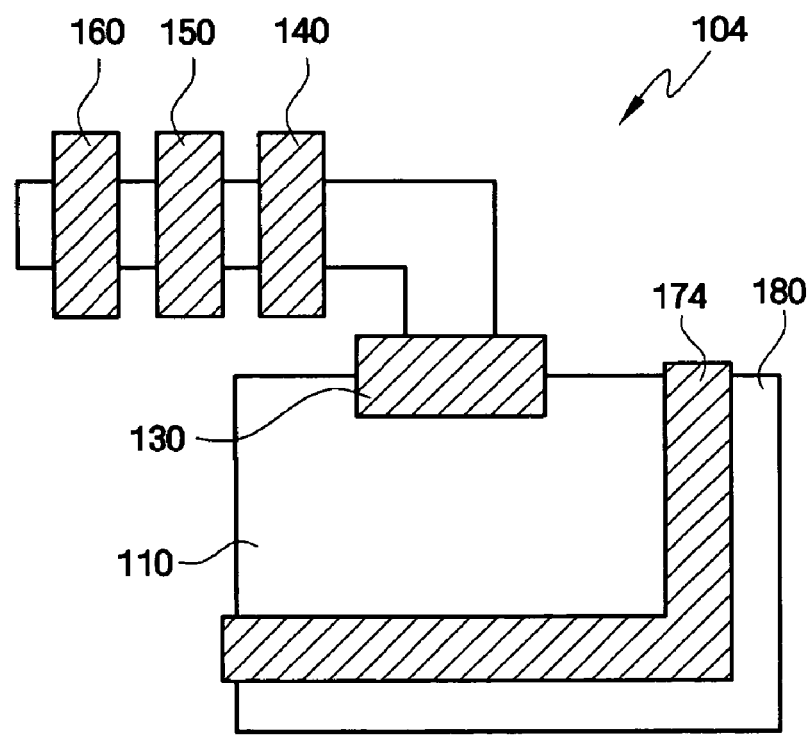
FIG. 8 is a schematic plan view of a unit pixel of an image sensor according to a further embodiment of the present invention.

FIG. 7 is a schematic plan view of a unit pixel of an image sensor according to yet another embodiment of the present invention. FIG. 8 is a schematic plan view of a unit pixel of an image sensor according to an embodiment of the present invention. For brevity, components having the same function as described with reference to FIG. 3 are respectively identified by the same reference numeral and a repetitive description thereof will be omitted.

Referring to FIG. 7, a unit pixel 103 includes a second charge transmitter 173 formed substantially adjacent to an edge of the photoelectric converter 110. The second charge transmitter 173 has a width W which is at least half of the span, e.g., length, width, etc., of the photoelectric converter 110. When the width W of the second charge transmitter 173 increases, a region through which excess charges can pass increases, thereby improving a drain characteristic.

Referring to FIG. 8, a unit pixel 104 includes a second charge transmitter 174 formed substantially adjacent to at least one edge of the photoelectric converter 110. For example, the second charge transmitter 174 may be substantially adjacent to two edges of the photoelectric converter 110, as show in FIG. 8. The more edges of the photoelectric converter 110 the second charge transmitter 174 neighbors, the more the drain characteristic is improved. However, a fill factor needs to be considered to determine a region and width of the second charge transmitter 174.

Figure 9:
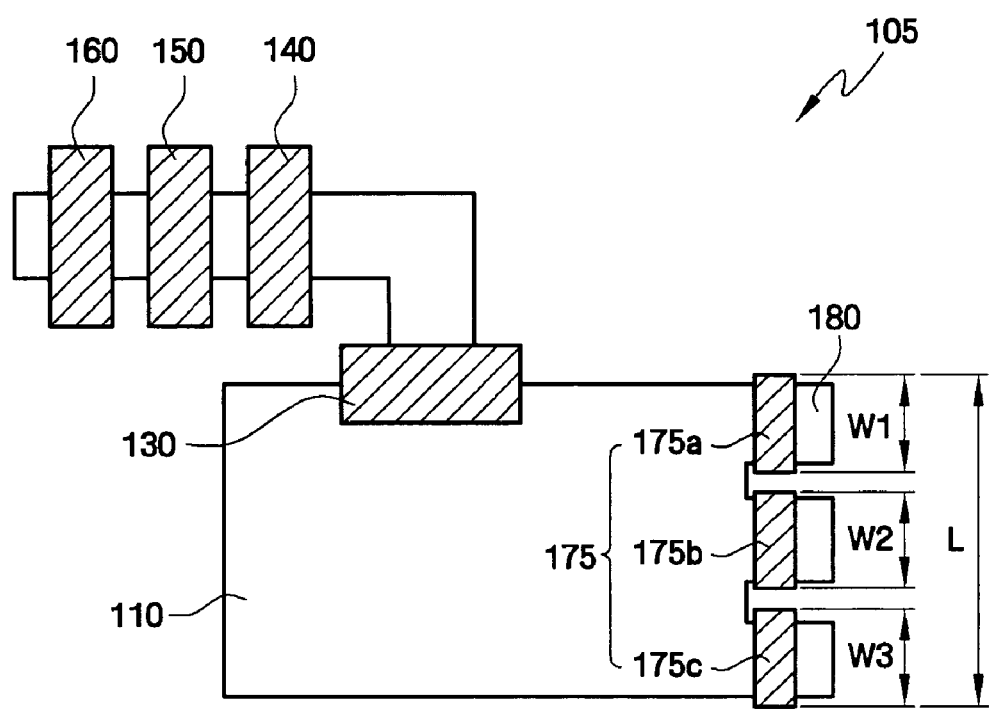
FIG. 9 is a schematic plan view of a unit pixel of an image sensor according to another embodiment of the present invention.
Figure 10:
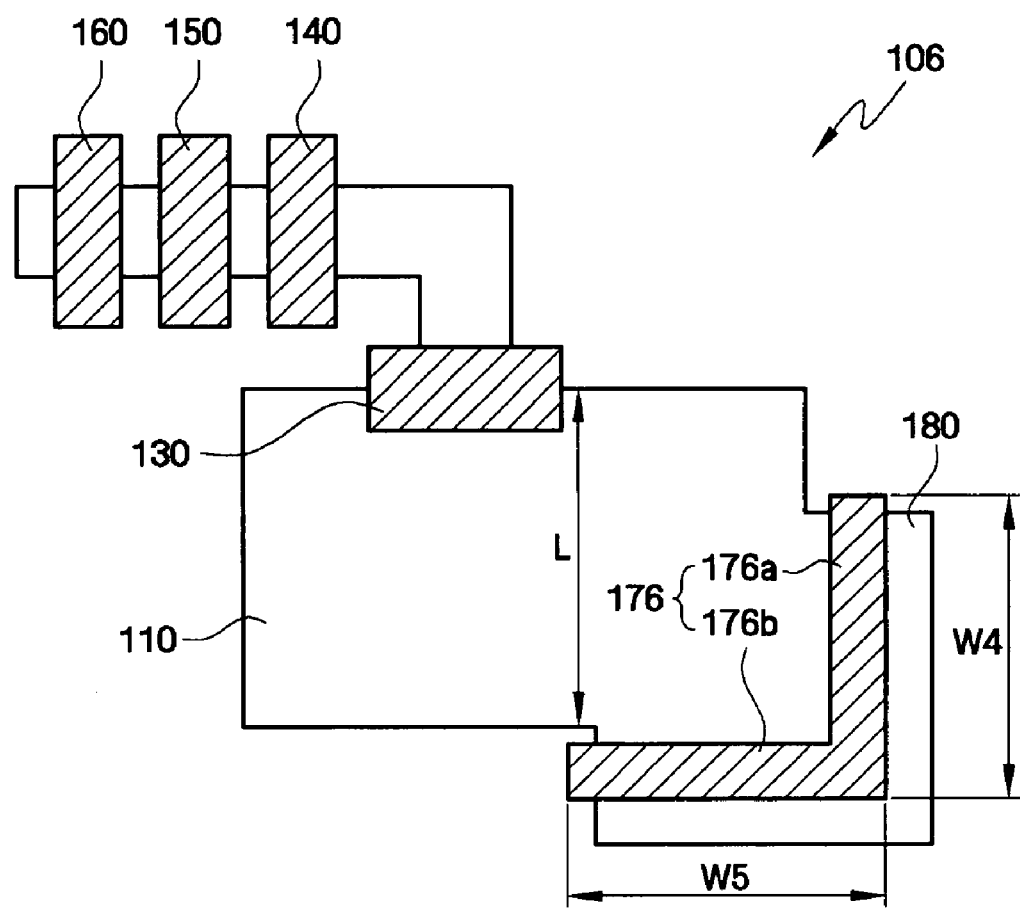
FIG. 10 is a schematic plan view of a unit pixel of an image sensor according to still another embodiment of the present invention.

FIG. 9 is a schematic plan view of a unit pixel of an image sensor according to another embodiment of the present invention. FIG. 10 is a schematic plan view of a unit pixel of an image sensor according to an embodiment of the present invention. For brevity, components having the same function as described with reference to FIG. 3 are respectively identified by the same reference numeral and a repetitive description thereof will be omitted.

Referring to FIG. 9, a unit pixel 105 comprises a second charge transmitter 175 including a second charge transmitter 175. The second charge transmitter 175 includes a plurality of sub-transmitters 175a, 175b, and 175c. The sub-transmitters 175a, 175b, and 175c are formed adjacent to an edge of the photoelectric converter 110. A combined width W1+W2+W3 of the sub-transmitters 175a, 175b and 175c may be at least half of the span L of the photoelectric converter 110 or may be substantially the same as the span L of the photoelectric converter 110 as shown in FIG. 9.

Referring to FIG. 10, a unit pixel 106 comprises a second charge transmitter 176 including a second charge transmitter 176. The second charge transmitter 176 includes a plurality of sub-transmitters 176a ad 176b. The sub-transmitters 176a and 176b are formed adjacent to two edges of the photoelectric converter 110 respectively. A width W4+W5 of the sub-transmitters 176a and 176b may be at least half of the span L of the photoelectric converter 110.

Figure 11:
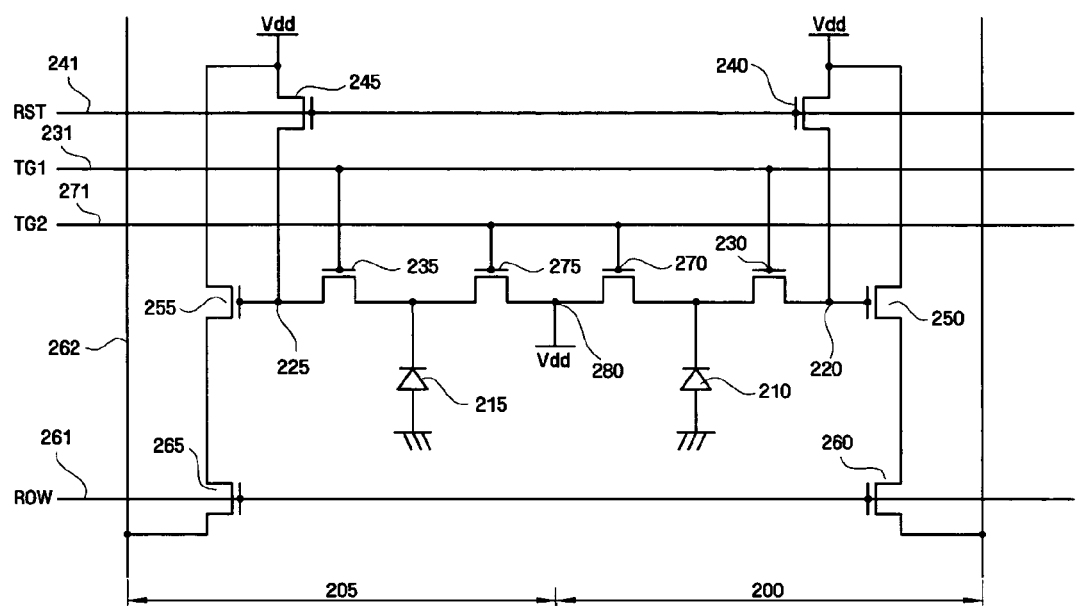
FIG. 11 is a circuit diagram of an image sensor according to yet another embodiment of the present invention.
Figure 12:
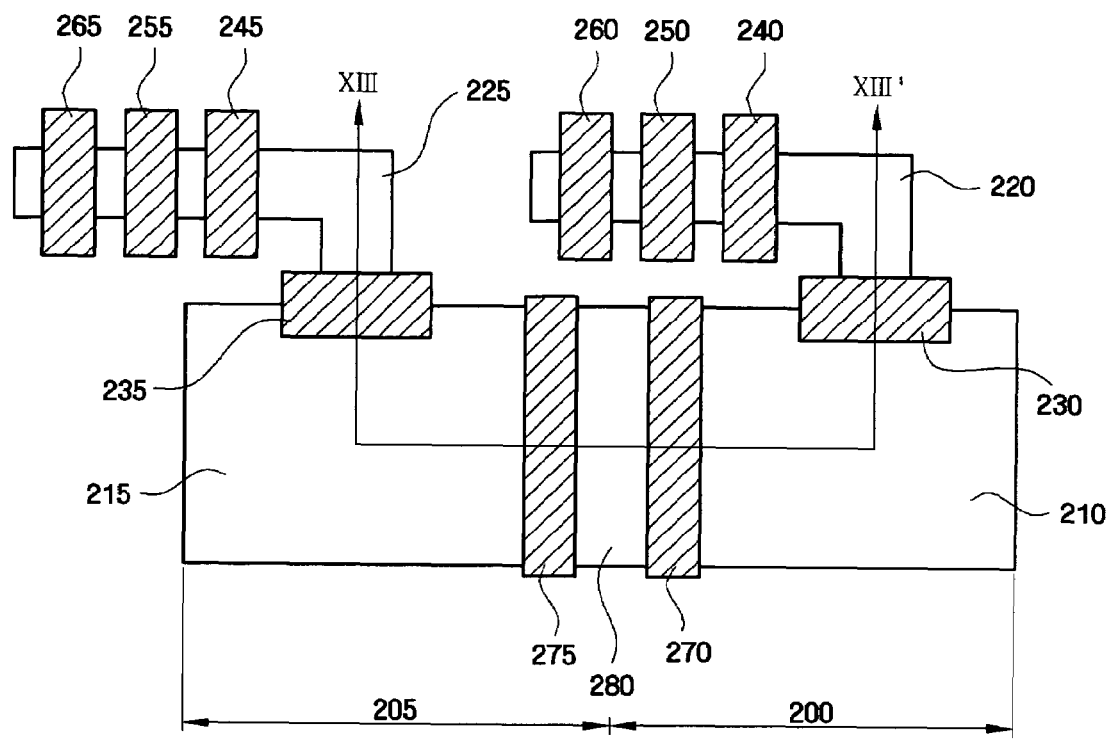
FIG. 12 is a schematic plan view of the image sensor of FIG. 11.
Figure 13:
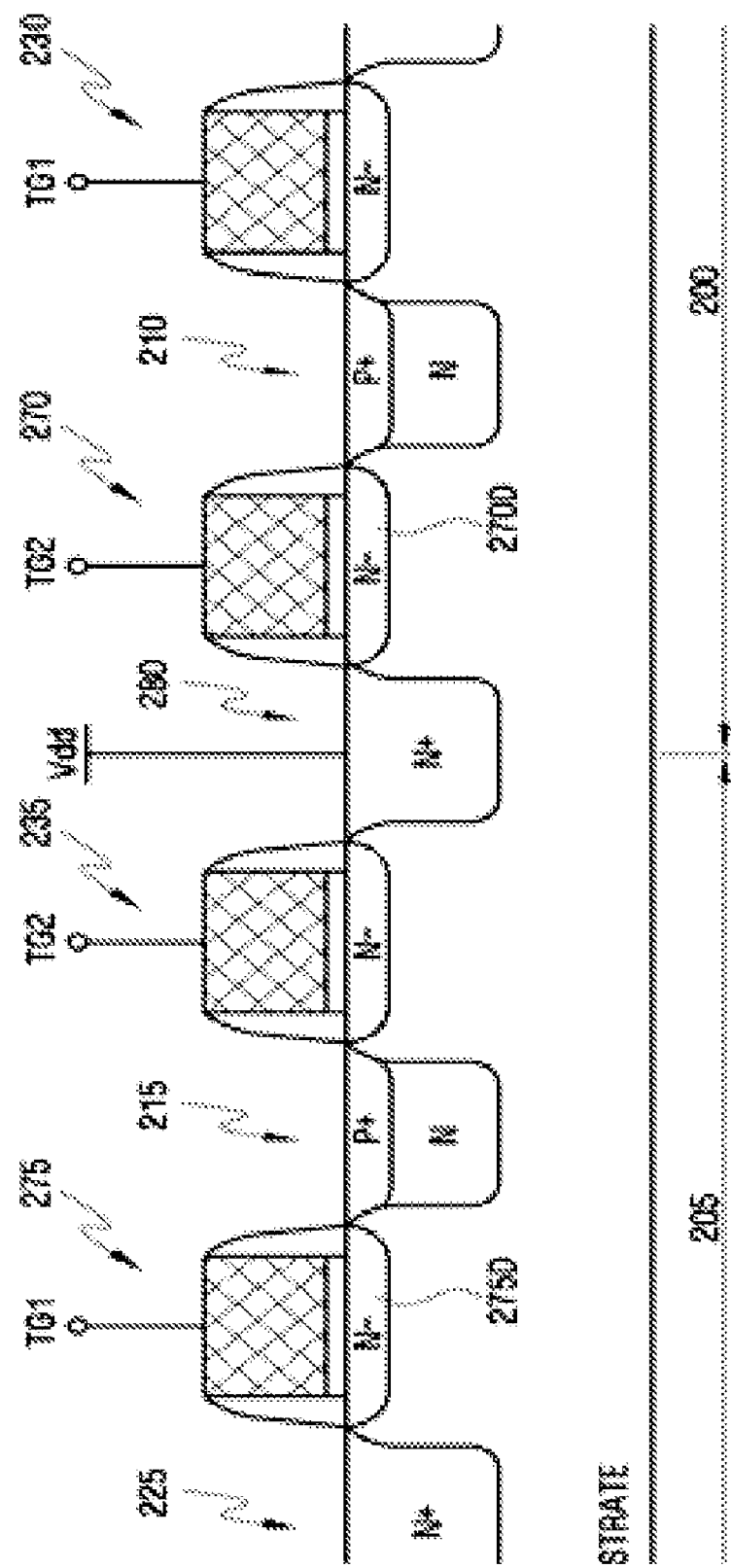
FIG. 13 is a cross sectional view of the image sensor, taken along the line XIII-XIII' shown in FIG. 12.

FIG. 11 is a circuit diagram of an image sensor according to yet another embodiment of the present invention. FIG. 12 is a schematic plan view of the image sensor of FIG. 11. FIG. 13 is a cross sectional view of the image sensor, taken along the line XIII-XIII' shown in FIG. 12.

Referring to FIGS. 11 through 13, an image sensor includes a pixel array (10 shown in FIG. 1) in which a plurality of unit pixels 200 and 205 are arranged in two dimensions. Each of the unit pixels 200 and 205 is substantially the same as the unit pixel 100 shown in FIGS. 2 through 4. The unit pixels 200 and 205 respectively include photoelectric converters 210 and 215, each of which is formed in a semiconductor substrate 202 to generate and integrate charges resulting from incident light, and first charge transmitters 230 and 235, which respectively transmit the integrated charges to charge detectors 220 and 225. The unit pixels 200 and 205 share an overflow drain region 280 which discharges excess charges generated by the photoelectric converters 210 and 215. A region between the photoelectric converters 210 and 215 is an active region in which second charge transmitters 270 and 275 and the overflow drain region 280 are formed.

The second charge transmitters 270 and 275 may be formed adjacent to at least one edge of the photoelectric converter 210 and at least one edge of the photoelectric converter 215, respectively. In addition, the second charge transmitters 270 and 275 have a dimension which may be at least half of a span of the respective photoelectric converters 210 and 215 or may be substantially the same as the span of the photoelectric converters 210 and 215, respectively, as shown in FIG. 12.

The second charge transmitter 270 may be a MOS transistor which has a gate electrode connected to the second charge transmission signal TG2, a source region electrically connected to the photoelectric converter 210, and a drain region electrically connected to the overflow drain region 280. Similarly, the second charge transmitter 275 may be a MOS transistor which has a gate electrode connected to the second charge transmission signal TG2, a source region electrically connected to the photoelectric converter 215, and a drain region electrically connected to the overflow drain region 280. The second charge transmitters 270 and 275 may further include ion-implantation regions 270D and 275D, respectively, underlying the gate electrodes. A potential barrier can be adjusted using a voltage level of the second charge transmission signal TG2 applied to the gate electrodes and an ion concentration in each of the ion-implantation regions 270D and 275D.

Although not shown, in image sensors including unit pixels 101, 102, 103, 104, 105, and 106 shown in FIGS. 5 through 10, respectively, it will be obvious to those skilled in the art that unit pixels in each image sensor may share an overflow drain region.

Figure 14:
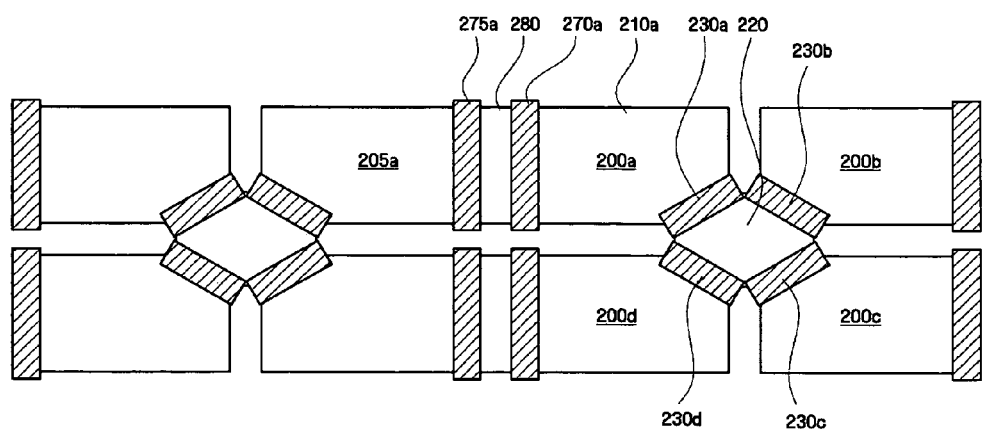
FIG. 14 is a schematic plan view of an image sensor according to an embodiment of the present invention.
Figure 15:
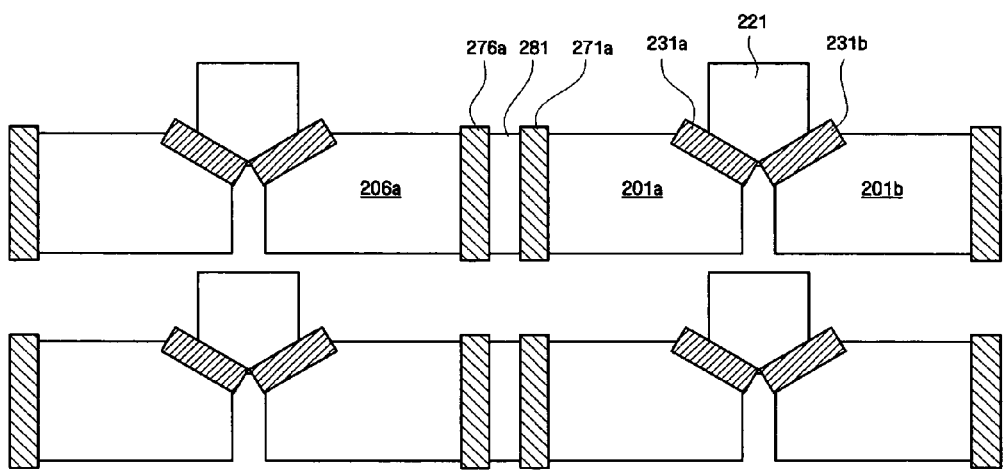
FIG. 15 is a schematic plan view of an image sensor according to an embodiment of the present invention.

FIG. 14 is a schematic plan view of an image sensor according to an embodiment of the present invention. FIG. 15 is a schematic plan view of an image sensor according to an embodiment of the present invention.

Referring to FIG. 14, a plurality of unit pixels, for example, four unit pixels 200a, 200b, 200c, and 200d share the charge detector 220. The unit pixels 200a, 200b, 200c, and 200d control ON and OFF states of first charge transmitters 230a, 230b, 230c, and 230d, respectively, to use the charge detector 220 in a time division manner. For example, when the charge detector 220 is used sequentially by the unit pixels 200a, 200b, 200c, and 200d, a photoelectric converter 210a of the unit pixel 200d may generate charges while the unit pixel 200a is read out. Accordingly, image distortion due to a time difference may occur. As shown in FIG. 14, adjacent unit pixels 200a and 205a share the overflow drain region 280 via second charge transmitters 270a and 275a. Accordingly, image distortion due to a readout time difference is reduced. The unit pixels 200a and 205a that do not share the charge detector 220 share the overflow drain region 280, but the present invention is not restricted thereto. Although not shown, it will be obvious to those skilled in the art that the overflow drain region 180 shown in FIGS. 5 through 10 may be shared by unit pixels.

Referring to FIG. 15, two unit pixels 201a and 201b share a charge detector 221. The unit pixels 201a and 201b control ON and OFF states of first charge transmitters 231a and 231b, respectively, to use the charge detector 221 in a time division manner. Here, adjacent unit pixels 201a and 206a share an overflow drain region 281 via second charge transmitters 271a and 276a.

Figure 16:
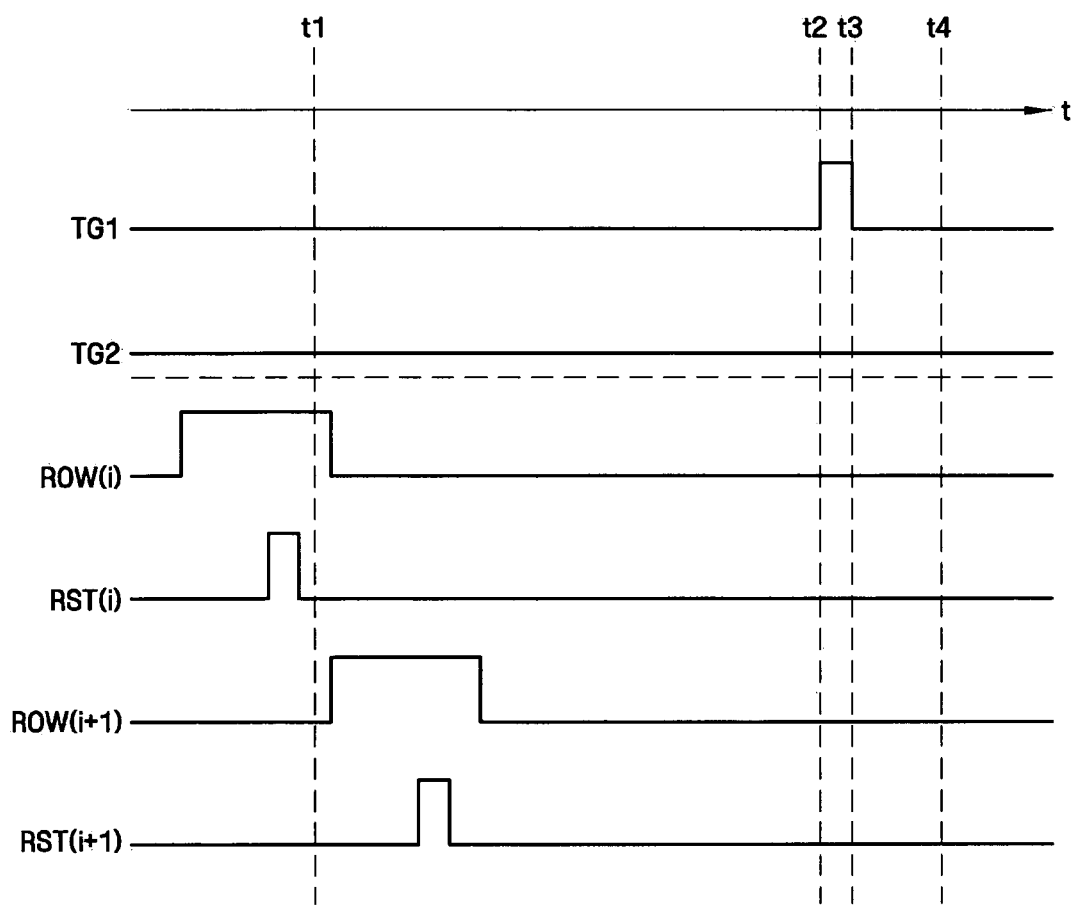
FIG. 16 is a timing chart of an image sensor according to an embodiment of the present invention.
Figure 17:
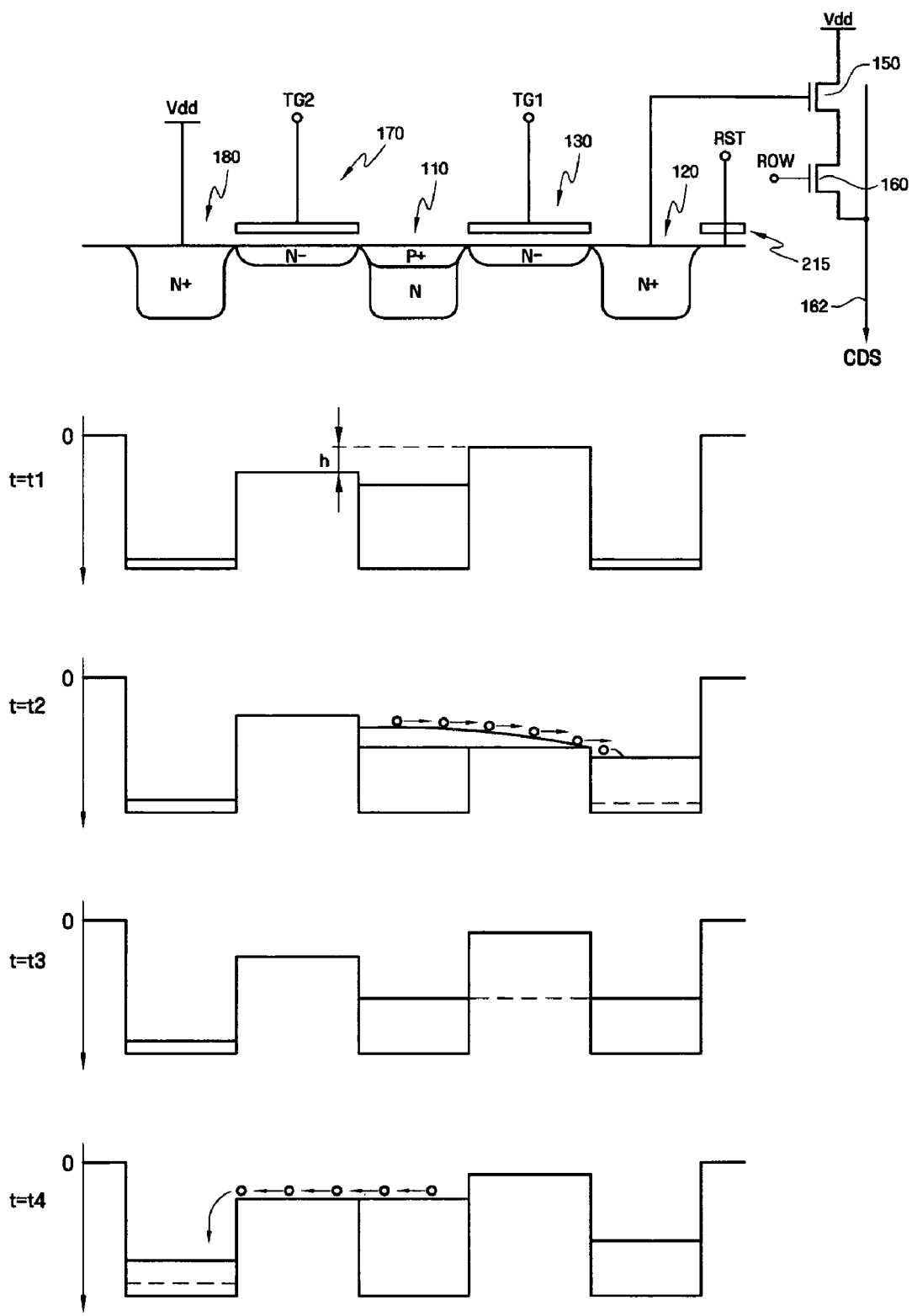
FIG. 17 illustrates the concept of an image sensor and potential diagrams according to an embodiment of the present invention.

FIG. 16 is a timing chart of an image sensor according to an embodiment of the present invention. FIG. 17 illustrates the concept of an image sensor and potential diagrams according to an embodiment of the present invention. In the drawings, a dotted line indicates a potential level before the operation and a solid line indicates the potential level after the operation. In potential diagrams shown in FIG. 17, a downward direction indicates an increasing direction of a potential.

The operation of an image sensor using a PPD as the photoelectric converter 110 according to an embodiment of the present invention will be described with reference to FIGS. 16 and 17.

Unit pixels in a pixel array (10 shown in FIG. 1) integrate charges in common. The first and second charge transmission signals TG1 and TG2 are common signals to all rows of unit pixels in the pixel array. Here, it is assumed that the second charge transmission signal TG2 is a predetermined positive voltage. The reset signal RST and the pixel selection signal ROW are common to only unit pixels on a particular row in the pixel array. The unit pixels on the particular row are provided with unique reset signal RST and a unique pixel selection signal ROW.

The pixel array includes N rows of unit pixels. The N rows are read sequentially in order of ROW(1), . . . , ROW(i), ROW(i+1), . . . , ROW(N). For clarity, the description will be made with respect to the ROW(i). The pixel selection signal ROW, the reset signal RST, and the first and second charge transmission signals TG1 and TG2 are provided to the pixel array 10 shown in FIG. 1 by the row driver 40 controlled by the timing generator 20. In response to the plurality of signals ROW, RST, TG1, and TG2, the pixel array 10 integrates charges and transmits the integrated charges to the charge detector 120 simultaneously. The charge detector 120 double samples a noise level and a signal level.

Before a time t1, while the pixel selection signal ROW(i) for an i-th row is at a logic high level, lines of an image frame that has been previously stored in the charge detector 120 are sequentially output through the vertical signal line 162. Thereafter, the reset signal RST(i) transits to a logic high level, and the charge detector 120 is reset.

At the time t1, a different offset level, e.g., a noise level, is read from each pixel via the vertical signal line 162. Although not shown, the noise level on the vertical signal line 162 is preserved in the CDS 50 (FIG. 1) using a sample hold pulse SHP. The photoelectric converter 110 is exposed to incident light and thus generates and integrates charges resulting from the incident light.

In addition, a predetermined positive voltage is constantly applied to the second charge transmitter 170. A potential barrier peak of the second charge transmitter 170 is lower than a potential barrier peak of the first charge transmitter 130 by a predetermined difference "h".

At a time t2, the first charge transmission signal TG1 transits to a logic high level and the integrated charges are transmitted from the photoelectric converter 110 to the charge detector 120 on every row in the pixel array 10. Since the charge detector 120 has a parasitic capacitance, stored charges accumulate, and the potential of the charge detector 120 changes.

At a time t3, the first charge transmission signal TG1 transits to a logic low level. Thereafter, the potential, e.g., a signal level, stored in the charge detector 120 is read via the vertical signal line 162 sequentially starting from the first row of unit pixels in the pixel array 10. Although not shown, the signal level on the vertical signal line 162 is preserved in the CDS 50 using the SHP. The noise level and the signal level are sequentially sampled with respect to a single unit pixel 100.

With such operation, output of the noise level and the signal level is controlled using a predetermined switch, and therefore, a fixed noise level does not occur even if the noise level and the signal level are output through the same path. In addition, since the noise level and the signal level are sequentially output, a difference therebetween can be obtained using a differential circuit, e.g., the CDS 50, without using a separate memory, thereby simplifying a system.

At a time t4, the potential stored in the charge detector 120 on the i-th row is not read. Since the photoelectric converter 110 is exposed to the incident light, excess charges may be continuously generated. A potential barrier of the second charge transmitter 170 is lower than a maximum potential barrier of the first charge transmitter 130, and therefore, the excess charges do not overflow into the charge detector 120 but are discharged through the overflow drain region 180. Accordingly, an electrical shutter operation is stable even in the SFCM so that a frame image stored in the charge detector 120 is not distorted.

Thereafter, a plurality of processes are performed until the image frame is displayed by an image signal processor (not shown). For example, the CDS 50 outputs a differential level between the noise level and the signal level. Accordingly, a fixed noise level due to characteristic dispersion of the unit pixel 100 and the vertical signal line 162 is suppressed. In addition, the ADC 60 converts an analog signal output from the CDS 50 into a digital signal.

For clarity of the description, an all pixel independent reading mode, in which a signal of every unit pixel 100 is independently read, has been explained, but the present invention is not restricted thereto. For example, a frame reading mode, in which a signal of odd (or even) lines is read in a first field and a signal of even (or odd) lines is read in the second field, may be used. Alternatively, a field reading mode, in which signals are simultaneously read from two adjacent lines, voltages of the signals are added, and a combination of two lines is changed in each field, may be used.

Those skilled in the art will appreciate that many variations and modifications can be made to embodiments described herein without substantially departing from the principles of the present invention. Therefore, embodiments of the invention are used in a generic and descriptive sense only and not for purposes of limitation.

What is claimed is:

1. An image sensor comprising a pixel array in which a plurality of unit pixels are arranged in two dimensions,
    wherein each unit pixel comprises a photoelectric converter formed in a semiconductor substrate to generate charges and integrate the charges resulting from incident light, a first charge transmitter transmitting integrated charges to a charge detector, an overflow drain region discharging excess charges generated by the photoelectric converter, and a second charge transmitter transmitting the excess charges to the overflow drain region and having a width which is at least half of a span of the photoelectric converter, and
    the photoelectric converters of the plurality of unit pixels share the overflow drain region via second charge transmitters of the plurality of unit pixels, wherein the overflow drain region is disposed substantially between the second charge transmitters of the photoelectric converters,
    wherein the photoelectric converters of a plurality of unit pixels share the charge detector via first charge transmitters of the plurality of unit pixels, and wherein a first photoelectric converter shares a respective overflow drain region with a second adjacent photoelectric converter and a respective charge detector with a third adjacent photoelectric converter, the first, second, and third photoelectric converters being disposed in one of a row or column, wherein adjacent photoelectric converters do not share both the charge detector and the overflow drain region.

2. The image sensor of claim 1, wherein the width of the second charge transmitter is substantially the same as that of the span of the photoelectric converter.

3. The image sensor of claim 1, wherein the second charge transmitter is formed to be adjacent to at least one edge of the photoelectric converter.

4. The image sensor of claim 1, wherein the second charge transmitter comprises a plurality of transistors having a combined width forming the width of the second charge transmitter.

5. The image sensor of claim 1, wherein a potential barrier peak of the second charge transmitter is lower than a potential barrier peak of the first charge transmitter.

6. The image sensor of claim 1, wherein the second charge transmitter is a metal-oxide semiconductor (MOS) transistor that has a gate electrode electrically connected to a charge transmission signal, a source region electrically connected to the photoelectric converter, and a drain region electrically connected to the overflow drain region.

7. The image sensor of claim 1, wherein the second charge transmitter is an ion-implantation region formed in the semiconductor substrate.

8. The image sensor of claim 4, wherein a combined width of the transistors is at least half of the span of the photoelectric converter.

9. The image sensor of claim 4, wherein the transistors are adjacent to at least one edge of the photoelectric converter.

10. The image sensor of claim 8, wherein the combined width of the transistors is substantially the same as that of the span of the photoelectric converter.

11. The image sensor of claim 6, wherein the second charge transmitter further comprises an ion-implantation region underlying the gate electrode, the ion-implantation region controlling a potential barrier.

12. The image sensor of claim 6, wherein the MOS transistor is a trench-type MOS transistor.

* * * * *